United States Patent
Tominari et al.

(10) Patent No.: US 9,905,638 B1
(45) Date of Patent: Feb. 27, 2018

(54) SILICON EPITAXY FOR HIGH ASPECT RATIO, SUBSTANTIALLY PERPENDICULAR DEEP SILICON TRENCH

(71) Applicant: Texas Instruments Incorporated, Dallas, TX (US)

(72) Inventors: Tatsuya Tominari, Tsukuba (JP); Satoshi Suzuki, Ushiku (JP); Seetharaman Sridhar, Richardson, TX (US); Christopher Boguslaw Kocon, Mountain Top, PA (US); Simon John Molloy, Allentown, PA (US); Hideaki Kawahara, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/281,865

(22) Filed: Sep. 30, 2016

(51) Int. Cl.
*H01L 29/06* (2006.01)
*H01L 21/02* (2006.01)
*H01L 21/306* (2006.01)
*H01L 29/167* (2006.01)

(52) U.S. Cl.
CPC .... *H01L 29/0634* (2013.01); *H01L 21/02532* (2013.01); *H01L 21/30604* (2013.01); *H01L 29/167* (2013.01)

(58) Field of Classification Search
CPC ............... H01L 29/0634; H01L 29/167; H01L 21/30604; H01L 21/02532
See application file for complete search history.

(56) References Cited

U.S. PATENT DOCUMENTS

2009/0079002 A1* 3/2009 Lee .................. H01L 29/66712
257/355

* cited by examiner

*Primary Examiner* — Michael Jung
*Assistant Examiner* — Charles R Peters
(74) *Attorney, Agent, or Firm* — Jacqueline J. Garner; Charles A. Brill; Frank D. Cimino

(57) ABSTRACT

A method of forming a semiconductor device includes etching a high aspect ratio, substantially perpendicular trench in a semiconductor region doped with a first dopant having first conductivity type and performing a first cycle for depositing silicon doped with a second dopant on an inner surface of the high aspect ratio, substantially perpendicular trench, the first cycle comprising alternately depositing silicon at a first constant pressure and etching the deposited silicon at an etching pressure that ramps up from a first value to a second value, the second dopant having a second conductivity type that is opposite from the first conductivity type.

20 Claims, 10 Drawing Sheets

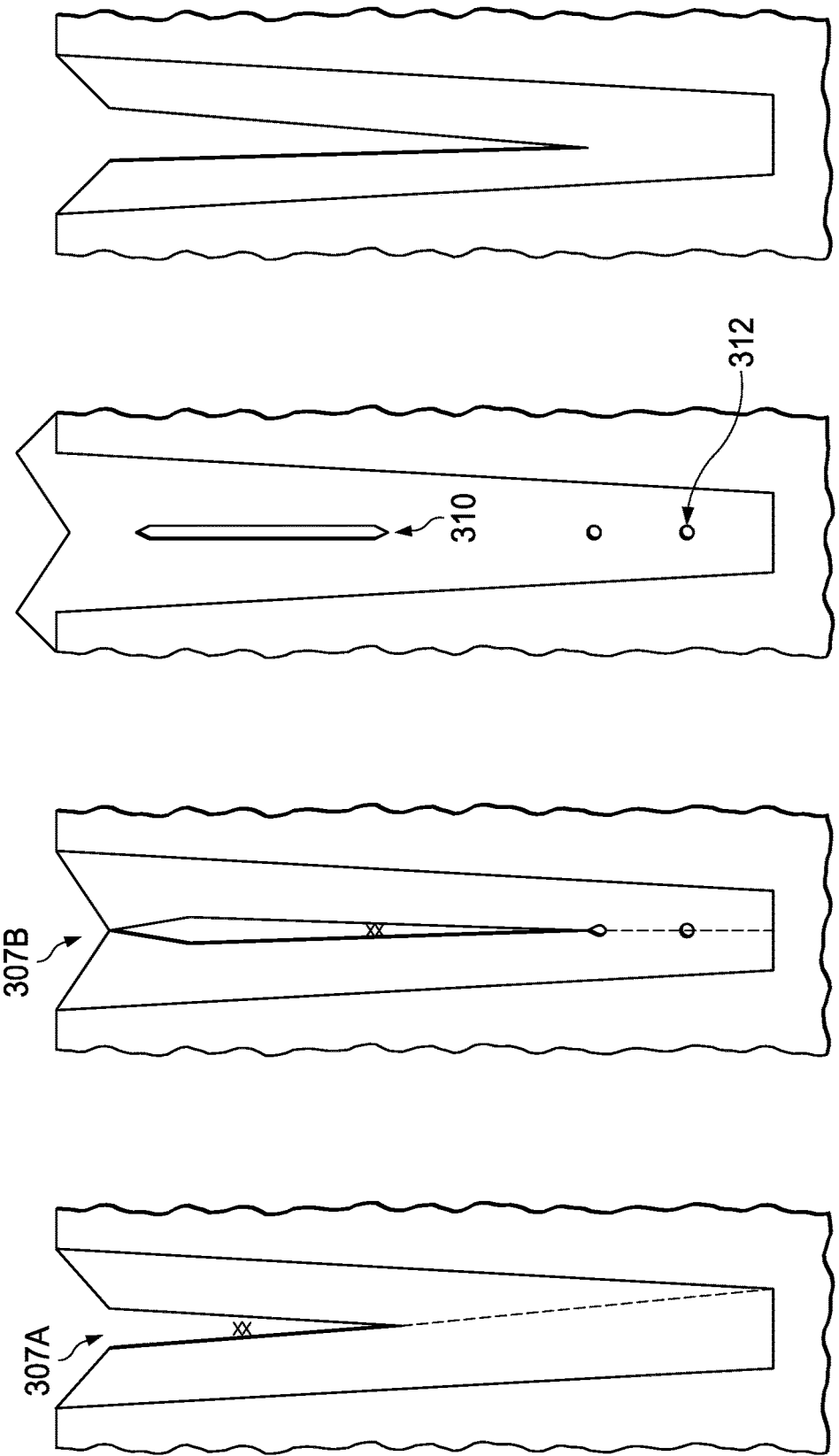

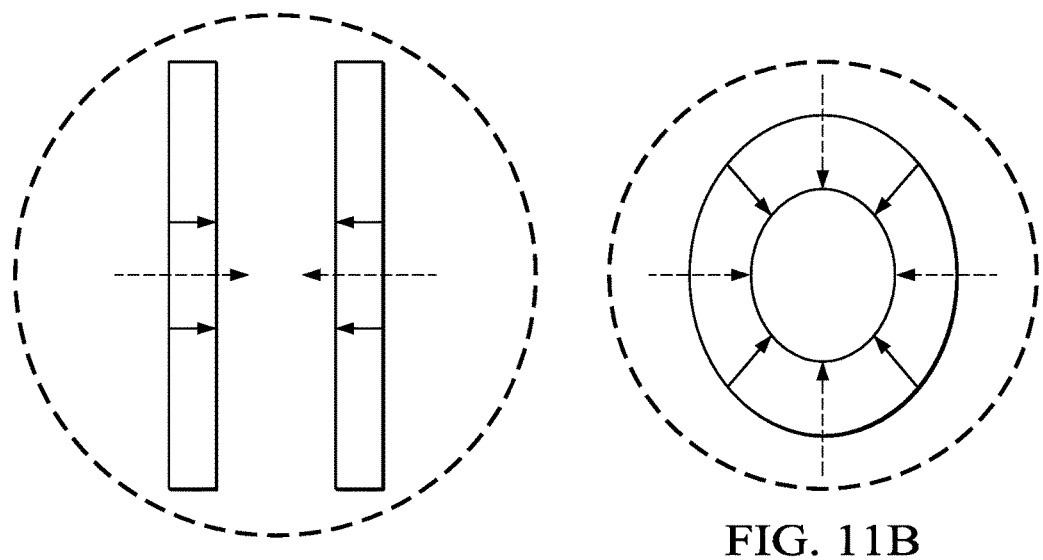
FIG. 11A
(PRIOR ART)
FIG. 11B
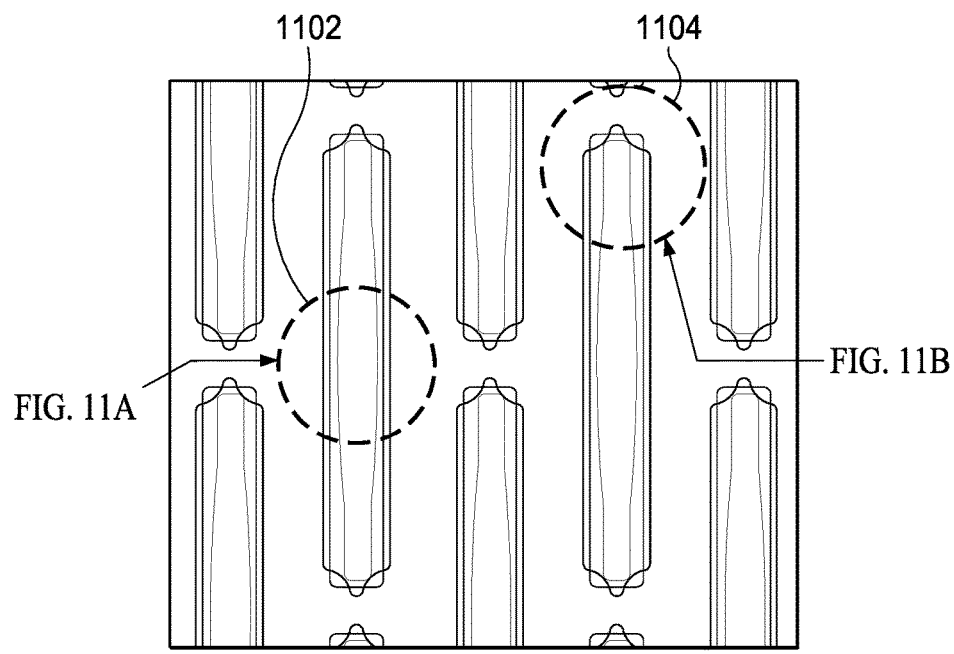
FIG. 11C

SILICON EPITAXY FOR HIGH ASPECT RATIO, SUBSTANTIALLY PERPENDICULAR DEEP SILICON TRENCH

FIELD OF THE DISCLOSURE

Disclosed embodiments relate generally to the field of forming epitaxial layers in integrated circuits. More particularly, and not by way of any limitation, the present disclosure is directed to silicon epitaxy for a high aspect ratio, substantially perpendicular deep silicon trench.

BACKGROUND

Power Metal Oxide Silicon Field Effect Transistors (MOSFETs) that require higher voltages rely on super junction structures that are generated by deep trench etching and an epitaxial (EPI) filling process. FIGS. 1A-D illustrate in a general way the process used to create these super junction structures. In FIG. 1A, N– epitaxial layer 104 is grown on an N+ substrate 102. In FIG. 1B, a thick layer of silicon dioxide 106 is grown or deposited on the surface of N– epitaxial layer 104 to act as a hardmask during etching. Silicon dioxide layer 106 is patterned for the creation of trenches, followed by an etching step to form trenches 107. In one example, trench 107 is 4 microns wide and 50 microns deep, extending almost to substrate 102. It will be understood that these figures are not drawn to scale, but are provided as illustrations only.

In FIG. 1C, P– epitaxial layer 108 is grown on the inner surface of trenches 107 to form deep silicon buried pillars in N– epitaxial layer 104. As shown, the P– epitaxial layer 108 is grown to overfill trenches 107. As seen in FIG. 1D, overfilled portions of epitaxial layer 108 are removed in a chemical-mechanical polishing (CMP) process that uses the hardmask formed by silicon dioxide 106 as a stopping point. This figure illustrates the super junction structures after the removal of silicon dioxide layer 106. In conventional power MOSFETS, there is a trade-off relationship between the on-state resistance ($R_{ON}$) and the breakdown voltage (BV). The super junction structures allow a higher voltage MOSFET with a lower resistance than otherwise possible and are important in high voltage power devices. The high aspect ratio, substantially perpendicular, trench profile is preferred in terms of trade-off between on-resistance and breakdown voltage; however, these high aspect ratio, substantially perpendicular deep trenches provide a difficult environment with regard to epitaxial growth, as will be explained in greater detail below. Improvements in epitaxial growth in deep trenches are needed.

SUMMARY

Disclosed embodiments implement both novel methods and novel shapes for improved epitaxial growth in high aspect ratio, substantially perpendicular deep trenches. Applicants have shown that ramping the pressure upwards during the etching portion of an etching/deposition cycle creates a more desirable shape for bottom-up growth. Similarly, depositing silicon at a higher pressure for a first deposition/etching cycle and at a lower pressure for a second deposition/etching cycle can provide better filling of the high aspect ratio, substantially perpendicular deep trench. Applicants have also shown that forming rectangular or circular/elliptical trenches, rather than trenches that form a long line, provides better filling. A combination of these three changes can provide one or more of improved filling, fewer voids and seams, fewer defects and faster growth.

In one aspect, an embodiment of a method of forming a semiconductor device is disclosed. The method includes etching a high aspect ratio, substantially perpendicular deep trench in a semiconductor region doped with a first dopant having first conductivity type; and performing a first cycle for depositing epitaxial silicon doped with a second dopant on an inner surface of said high aspect ratio, substantially perpendicular trench, said first cycle comprising alternately depositing epitaxial silicon at a first constant pressure and etching said deposited epitaxial silicon at an etching pressure that ramps up from a first value to a second value, said second dopant having a second conductivity type that is opposite from said first conductivity type.

In another aspect, an embodiment of a method of forming a semiconductor device is disclosed. The method includes etching a high aspect ratio, substantially perpendicular deep trench in a semiconductor region doped with a first dopant having first conductivity type; performing a first cycle for depositing epitaxial silicon doped with a second dopant on an inner surface of said high aspect ratio, substantially perpendicular deep trench, said first cycle comprising depositing epitaxial silicon at a first constant pressure, said second dopant having a second conductivity type that is opposite from said first conductivity type; and performing a second cycle for depositing epitaxial silicon doped with said second dopant, said second cycle comprising depositing epitaxial silicon at a second constant pressure that is lower than said first pressure.

In yet another aspect, an embodiment of a power MOSFET is disclosed. The high voltage MOSFET includes a doped layer overlying a substrate and having a first dopant with a first conductivity type; and high aspect ratio, substantially perpendicular deep trenches formed in said doped layer and substantially filled with silicon having a second conductivity type opposite from said first conductivity type to form high aspect ratio, substantially perpendicular deep silicon buried pillars, said high aspect ratio, substantially perpendicular deep silicon buried pillars having an intersection with a surface of said doped layer that forms one of a circle, an ellipse and a rectangle, said one of the ellipse and the rectangle having a length to width ratio of no more than 10:1.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 3A illustrates a midpoint in epitaxial growth in a traditional tapered trench;

FIGS. 3B-C illustrate a midpoint and an endpoint in epitaxial growth in a vertical trench having walls angled at greater than 89.5 degrees and illustrate issues encountered during the process;

FIG. 3D illustrates a midpoint target for epitaxial growth in a vertical trench such as shown in FIGS. 3B-C;

FIG. 11A schematically illustrates a top view growth pattern for epitaxial silicon using the line pattern of FIG. 10A;

FIG. 11B schematically illustrates a top view growth pattern for epitaxial silicon using the circular pattern of FIG. 10B; and FIG. 11C is a drawing made from a scanning electron microscope (SEM) photograph of a top view of half-filled silicon trenches formed using a rectangular shape and illustrates the differences in growth rate for linear and non-linear regions of the trench.

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Several definitions that apply throughout this disclosure will now be presented.

Deep trench: for trenches having a depth of 25 μm or greater, epitaxial filling of these trenches is difficult. Therefore, for the purposes of this application, a deep trench shall be defined as a trench having a depth of 25 μm or more; it is common to have deep trenches that are 40-50 microns deep.

High aspect ratio: for the purposes of this application, a trench (or the silicon pillar created in that trench) having a ratio of depth to width of greater than 6 is considered to be a high aspect ratio trench; in at least one embodiment, a high aspect ratio can be greater than 12, e.g., 13.

Substantially perpendicular: while the wall of a trench that is perfectly perpendicular to the surface of the semiconductor would form an angle of 90 degrees to the surface, for the purposes of this application, the trench is considered substantially perpendicular if the walls form an angle with the surface of the semiconductor that is greater than 89 degrees; in at least one embodiment, the angle formed with the surface is 89.5 or greater.

Growing silicon on a high voltage MOSFET can take a number of different forms and have distinct patterns of growth as shown below:
  Epitaxial growth (epitaxy): Single crystal is grown on the silicon substrate; the grown crystal orientation is aligned to the silicon substrate;
  Polysilicon growth: Polysilicon, which has many crystals and is not aligned in one direction, is grown on covered regions, e.g., having a layer of $SiO_2$ or SiN;
  Blanket epitaxial growth: epitaxial growth occurs on exposed silicon areas and polysilicon growth occurs simultaneously on covered regions; No HCl etching gas is used with dichlorosilane (DCS) at the deposition;
  Selective epitaxial growth (SEG): Epitaxial growth occurs only on exposed silicon areas; there is no growth on covered areas; HCl etching gas is always used with DCS at deposition, also referred to as HCl co-flow SEG.

Figure 1A:
FIGS. 1A-D illustrate in a general way the process used to create super junction structures in a substrate.
Figure 1B:
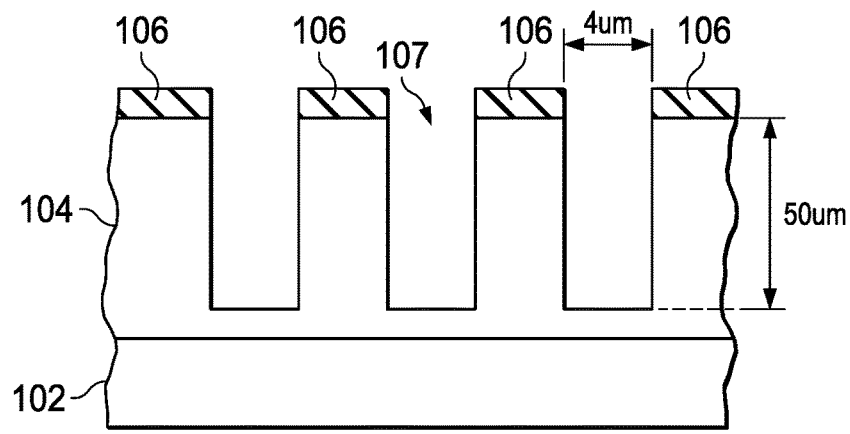
Figure 1C:
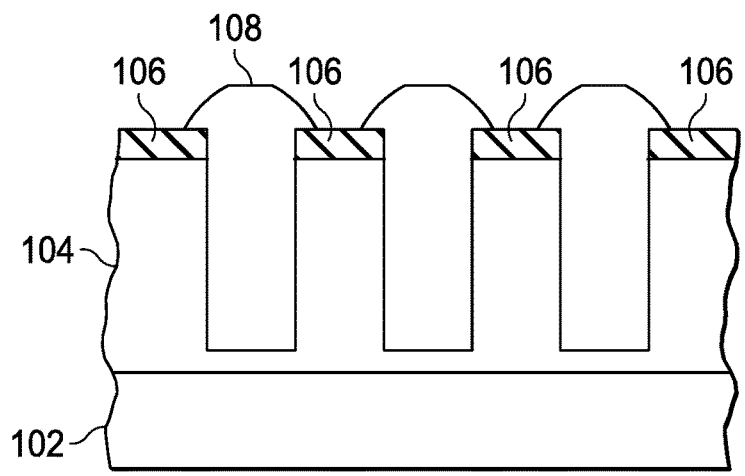
Figure 1D:
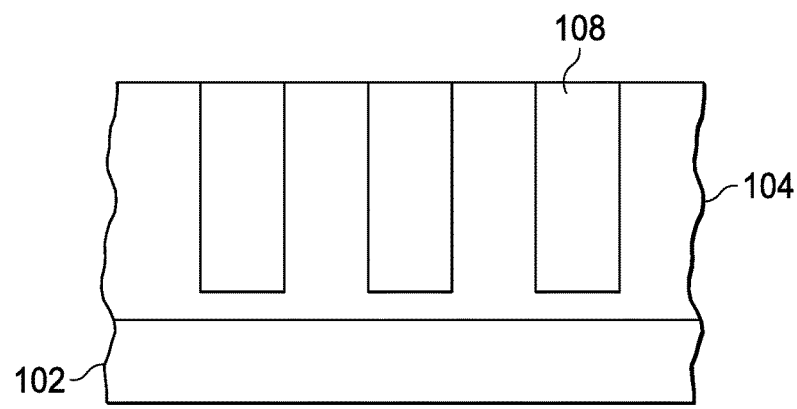
Figure 2A:
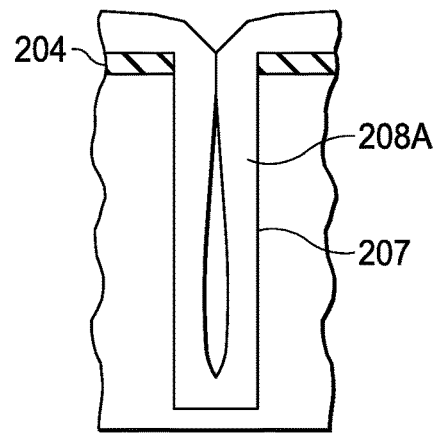
FIG. 2A depicts one problem that occurs when polysilicon is grown on a silicon dioxide layer as a hardmask during conventional blanket epitaxial growth.
Figure 2B:
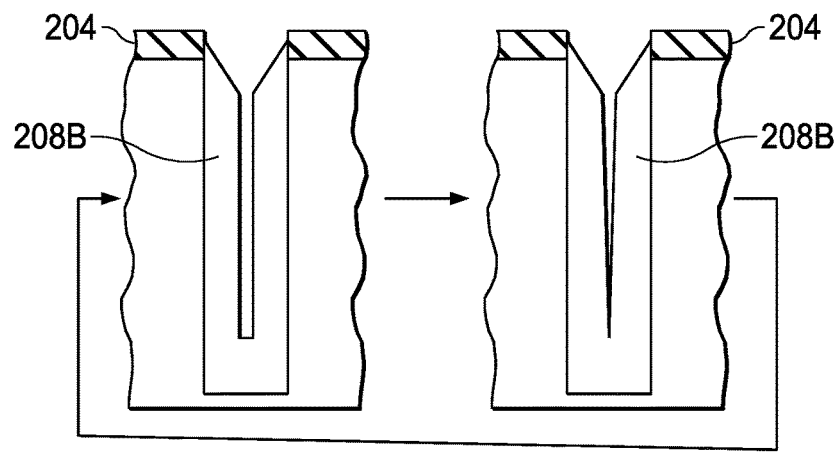
FIG. 2B depicts the desired results of a cyclical deposition and etch process that is used to avoid the issue shown in FIG. 2A.

FIG. 2A illustrates a typical non-selective (without HCl co-flow) blanket growth pattern of epitaxial silicon 208A in a trench 207 masked with a silicon dioxide layer 204. It is known that polysilicon growth occurs where $SiO_2$ covers a surface of the chip. As seen in this figure, this top polysilicon growth can close the opening of the deep trench, creating areas of necking near the upper surface of trench 207, which can lead to voids and seams in the epitaxial silicon layer being deposited. FIG. 2B illustrates a desired method to avoid this problem, which is to perform a cycle that alternates the HCl co-flow SEG deposition of epitaxial silicon with HCl etching of the silicon to create a desired tapered profile and to remove any necking created thus far. Epitaxial silicon 208B is formed using co-flows of HCl with silicon and doping precursors, e.g. dichlorosilane and boron, to perform selective epitaxial growth and silicon etching is performed using HCl. This cycle will be performed multiple times in order to properly fill a deep trench, e.g., 10-30 times. Ideally, the deposition stage creates minimal or no necking and the etching cycle opens the trench to form a tapering surface so that bottom-up growth occurs.

FIGS. 3A-3D illustrate some of the problems that are faced with depositing epitaxial silicon in high aspect ratio, substantially perpendicular trenches, such as those used to form super junction structures. FIG. 3A illustrates how a conventional tapered trench 307A is filled, with the sidewalls growing together from the bottom upwards so that the fill generally does not include voids or defects in the crystal. Applicants note that the facet plane on the upper area of epitaxial growth is fixed due to the low growth rate on this plane. In contrast to the tapered trenches, the high aspect ratio, substantially perpendicular trenches used in super junctions have, for example, sidewalls angled at 89.0° or greater and may have depths in the range of 40-50 µm. As seen in FIG. 3B, with a high aspect ratio, substantially perpendicular deep trench profile, deep, narrow spaces can be created by the steep angles of the walls. As seen in trench 307B, pinch-off has occurred at the trench opening, caused by a local loading effect due to the facet plane and presence of $SiO_2$ hardmask. At the same time, necking has occurred at deeper regions within the trench. When these conditions occur before deposition is complete, as seen here, they hamper the deposition gases from reaching the narrow bottom spaces of the trench. FIG. 3C illustrates the results of these issues, e.g., seam 310 and void 312.

The ideal deposition profile for a midpoint in the deposition of silicon in the high aspect ratio, substantially perpendicular deep trench is shown in FIG. 3D, where the growth is more like that of a tapered trench, i.e., closing from the bottom up. It is known that the approaches that reduce the occurrence of voids and seams tend to reduce the growth rate significantly, which then limits the throughput of the deposition tool. Additionally, pinch-off can induce stacking faults in the crystal structure and cause stress within the structure.

In order to achieve the target profile shown in FIG. 3D, Applicant notes that the following potential factors may improve deposition: supplying the gas(es) to the narrow bottom space and suppressing the local loading effect at facet boundary area, both of which are achieved by lowering the pressure to increase the mean free path and migration, and lowering the temperature to increase migration of the gas. Similarly, they note that the following factors may be used to provide improvements during etching: enhancing the amount of etching and the anisotropic nature of the etching process, both of which are achieved by increasing the pressure by ramping it up over time and increasing the flow of HCl. How to incorporate beneficial modifications without significantly decreasing the growth rate is a challenge.

Figure 4A:
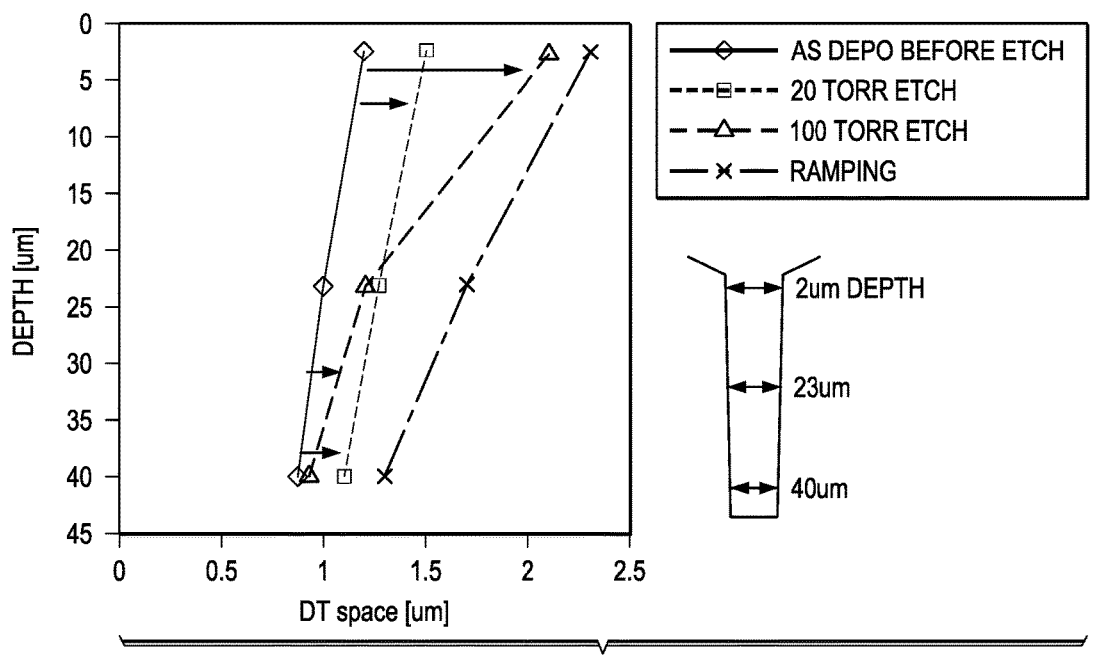
FIG. 4A illustrates the effectiveness of an etch performed at high pressure, low pressure, and using the pressure ramping procedure according to an embodiment of the disclosure.

FIG. 4A illustrates the effect of performing the etching portion of the process at various pressures, as well as using a disclosed pressure ramping process disclosed herein. In this figure, each line illustrates the measured width of the deep trench under different conditions and at three depths: 2 µm, 23 µm and 40 µm. The leftmost line represents the trench width after deposition and before etching. It can be seen that the width of the trench at a depth of 40 microns was approximately 0.8 microns; at 23 µm depth the width was approximately 1.0 µm; and at 2 µm the width was about 1.2 µm. When this trench was then etched at a pressure of 20 Torr, the etching phase provides a trench profile that is wider than the deposited trench by a substantially equal amount at all depths. Etching at 100 Torr, on the other hand, does not provide a conformal etch. Instead, as seen in the graph, at 100 Torr, the bottom of the trench is hardly etched at all, although the shallower regions are much more strongly etched as compared to the same operation at 20 Torr. When the etching is performed using a method of ramping the pressure from 20 Torr to 100 Torr, the combination proves very effective at providing the tapered shape most desired.

Figure 4B:
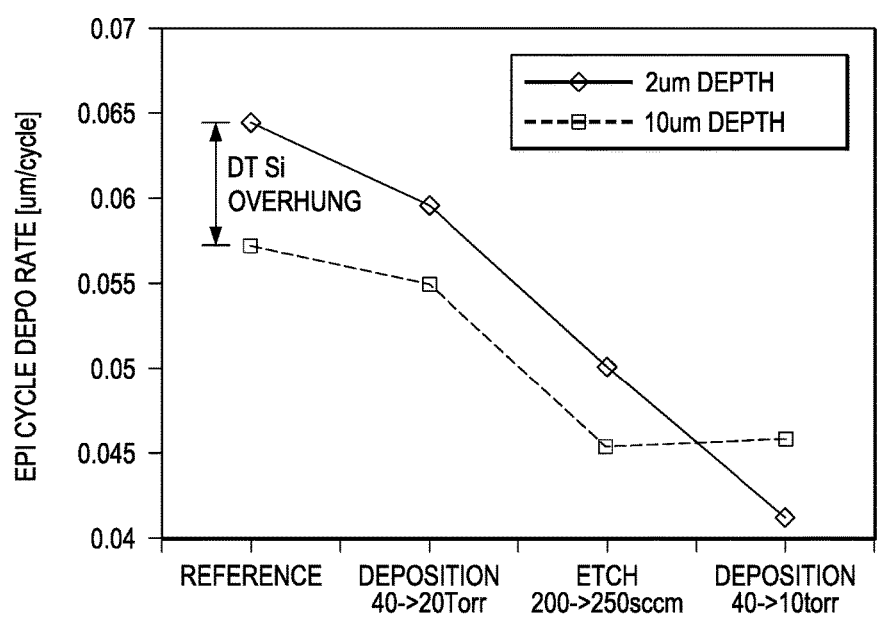
FIG. 4B illustrates the deposition rate of epitaxial silicon at different pressures and the effect when the flow of HCl is increased during the etch phase.

FIG. 4B illustrates the deposition rate of epitaxial silicon at different pressures and the effect when the flow of HCl is increased during the etch phase. As seen along the x-axis of this graph, four etch variations are compared: a reference value deposited at 40 Torr, deposition at 20 Torr, etching with an increased flow of HCl, and deposition at 10 Torr. Each example is documented at two depths—2 microns and 10 microns into the trench. The reference value shown on the left-hand side of the chart is associated with deposition at 40 Torr pressure prior to etching during the deposition/etching cycle. In this instance, the deposition rate is approximately 0.057 µm/cycle at a depth of 10 µm and approximately 0.064 µm/cycle at a depth of 2 µm, so that the profile of the deep trench is overhung at the upper end of the trench, which is, of course, undesirable. When the deposition stage is performed at a pressure of 20 Torr, shown by the second set of values, the deposition rate is approximately 0.055 µm/cycle at 10 µm depth and is approximately 0.06 µm/cycle at 2 µm depth, giving somewhat less of an overhang. Increasing the flow of HCl during the etch phase from 200 to 250 sccm does not significantly reduce the overhang, but does reduce the effective deposition rate to 0.05 µm at 2 µm depth. Performing the deposition at a pressure of 10 Torr produces deposition rates of approximately 0.046 µm/cycle at 10 µm depth and approximately 0.042 µm/cycle at 2 µm depth. With these latter values, the deposition rate is lowered, but there is no overhang.

Figure 5A:
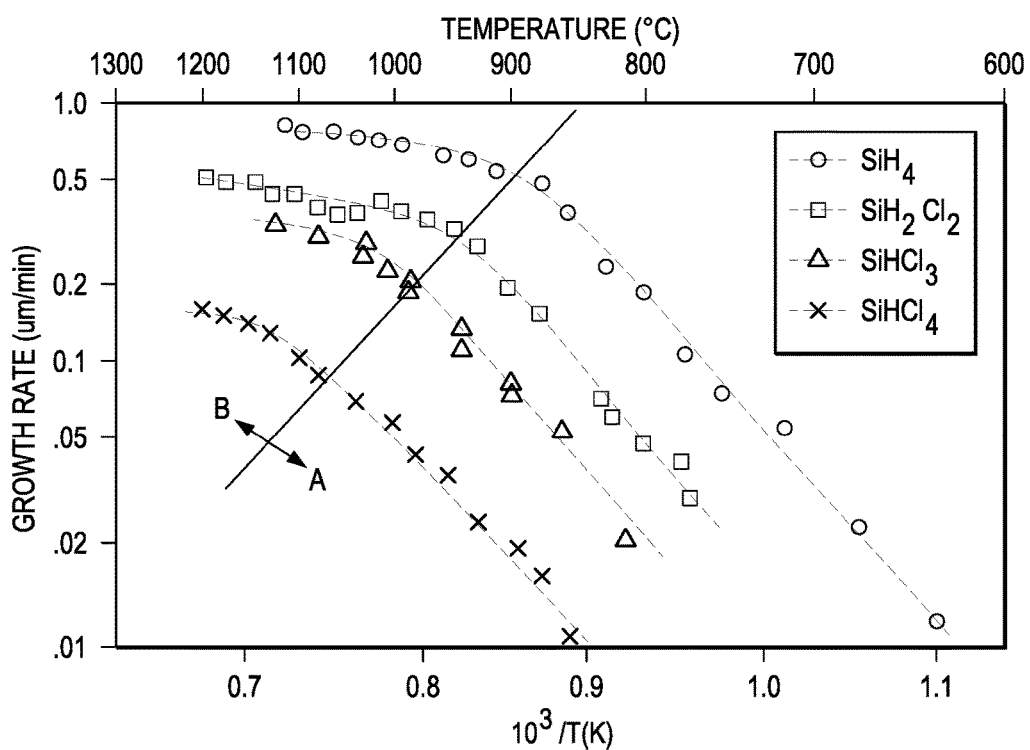
FIG. 5A illustrates the growth rate of epitaxial silicon using different precursors and at different temperatures.
Figure 5B:
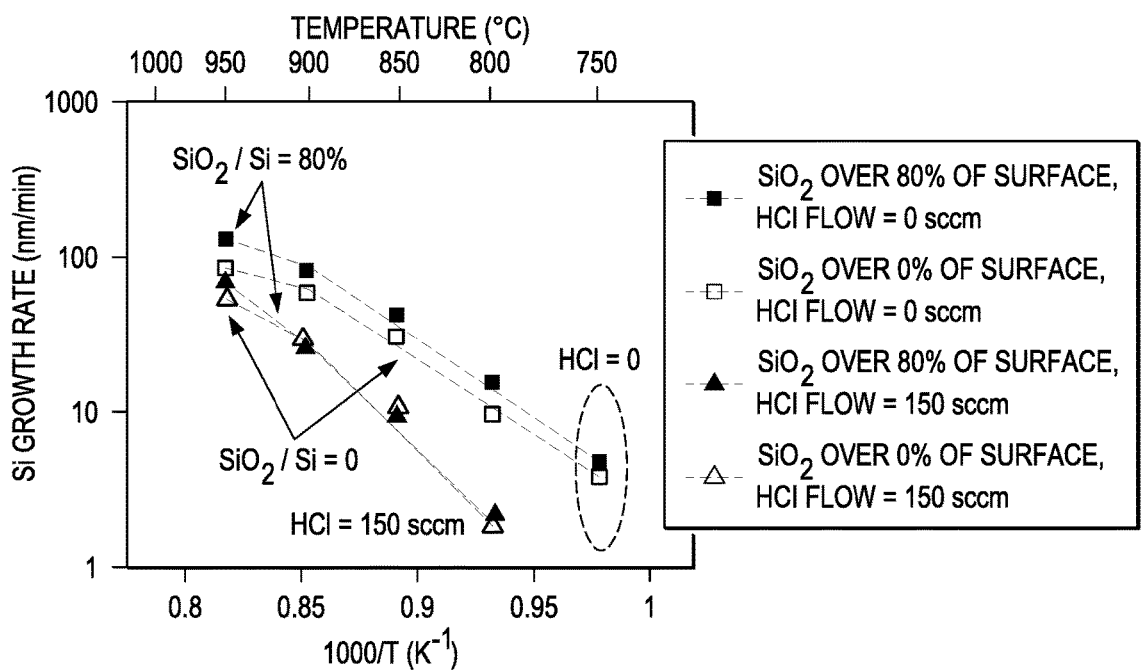
FIG. 5B illustrates the effect of the presence of a silicon dioxide layer and a co-flow of HCl on the growth rate of epitaxial silicon.

FIGS. 5A and 5B show how the growth rates of silicon is affected by factors such as the silicon precursor, temperature, presence of $SiO_2$ and a co-flow of HCl versus no HCl. FIG. 5A shows a graph that illustrates silicon growth rates using industrial low-pressure chemical vapor deposition tool, which is attributed to F. C. Eversteyn in Philips Res. Rep., 19, 45 (1974). Although dichlorosilane ($SiH_2Cl_2$) is used in at least one embodiment of the disclosed methodology, other precursor materials, such as $SiH_4$, $SiHCl_3$ and $SiCl_4$ can also be used, as shown in this figure. As seen here, the growth rate of silicon is affected by the temperature. This graph plots the growth rate against the inverse of the temperature in Kelvin; a corresponding temperature in Celsius is shown across the top of the chart. It can be seen that the growth rate is divided into two regions marked A and B. On the region labeled B, the growth is limited by the flowrate of the gas, while in the region labeled A, the growth is limited by the temperature. The growth mode changes around 900 C for dichlorosilane, so for this precursor, low temperature growth is defined as under 900 C.

FIG. 5B is an Arrhenius plot of silicon growth rate on both bare (0%) and 80% oxide covered wafer as a function of reciprocal temperature attributed to Bodnar et al., J. Vac. Sci. Technol. B 15(3) May/June 1997 pp 712-718. Gas flowrates of $SiH_2CL_2$ is equal to 200 sccm, while flowrates of HCl are shown for both 0 and 150 sccm. The highest growth rate is shown when the surface has 80% silicon dioxide coverage and no HCl co-flow; adding a co-flow of HCl in the presence of silicon dioxide coverage reduces the growth rate fairly evenly across the range of temperatures. Silicon growth when no silicon dioxide is present provides a somewhat slower growth rate, while the presence or lack of HCl co-flows only appears to affect this growth rate at the higher temperatures. Applicants have utilized all of the above discussed studies to devise a revised deposition/etching cycle as disclosed herein.

Figure 6A:
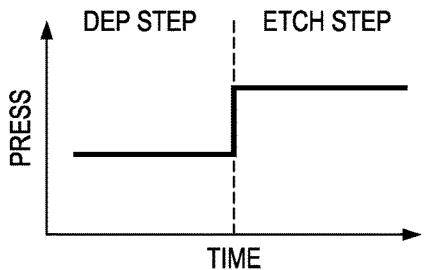
FIG. 6A depicts a typical pressure profile during a conventional deposition/etch cycle for epitaxial growth in a high aspect ratio, substantially perpendicular deep trench.
Figure 6B:
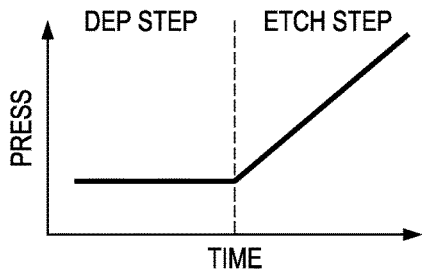
FIG. 6B depicts a pressure profile during the deposition/etch cycle for epitaxial growth in a high aspect ratio, substantially perpendicular deep trench according to an embodiment of the disclosure.

Turning next to FIG. 6A, chart 600A illustrates pressure versus time with regard to the deposition/etching cycle that is used to deposit silicon in deep, high aspect ratio trenches according to the prior art. As seen in this figure, a first pressure, e.g., 40 Torr, is used during the deposition portion of the cycle, while a higher pressure, e.g., 80 Torr, is used during the etching portion of the cycle. FIG. 6B illustrates the pressure versus time for a method of depositing epitaxial silicon according to an embodiment of the disclosure. As seen in graph 600B, the pressure during the deposition phase remains essentially constant. In this example, the pressure is lower than in previous processes and can be, for example, in the range of 5-20 Torr. In one embodiment, the deposition is performed at 20 Torr. In one embodiment, the deposition is performed at 10 Torr. The pressure during the etching phase starts off at the lower pressure used during the deposition phase and then ramps up over the course of the etching phase until the pressure reaches a desired higher pressure. In one embodiment, the etching phase starts at 20 Torr and ramps up over the etching phase to 100 Torr. In one embodiment, the etching phase starts at 10 Torr and ramps up to 100 Torr. The disclosed process effectively etches the bottom of the deep trench at low pressure and etches the upper portions of the deep trench at high pressure, enabling an anisotropic etch without a drastic decrease in deposition rate. Performing the deposition at a lower temperature, e.g., less than 900° C., can minimize the loading effect and lower pressure, e.g., 5-20 Torr, provides a smooth connection for the pressure ramping etching stage. Overall, the process provides filling for deep trenches that have fewer voids and seams and which have fewer defects in the crystal structure by promoting optimal bottom-up growth thanks to a tapered epitaxial profile during growth.

Figure 6C:
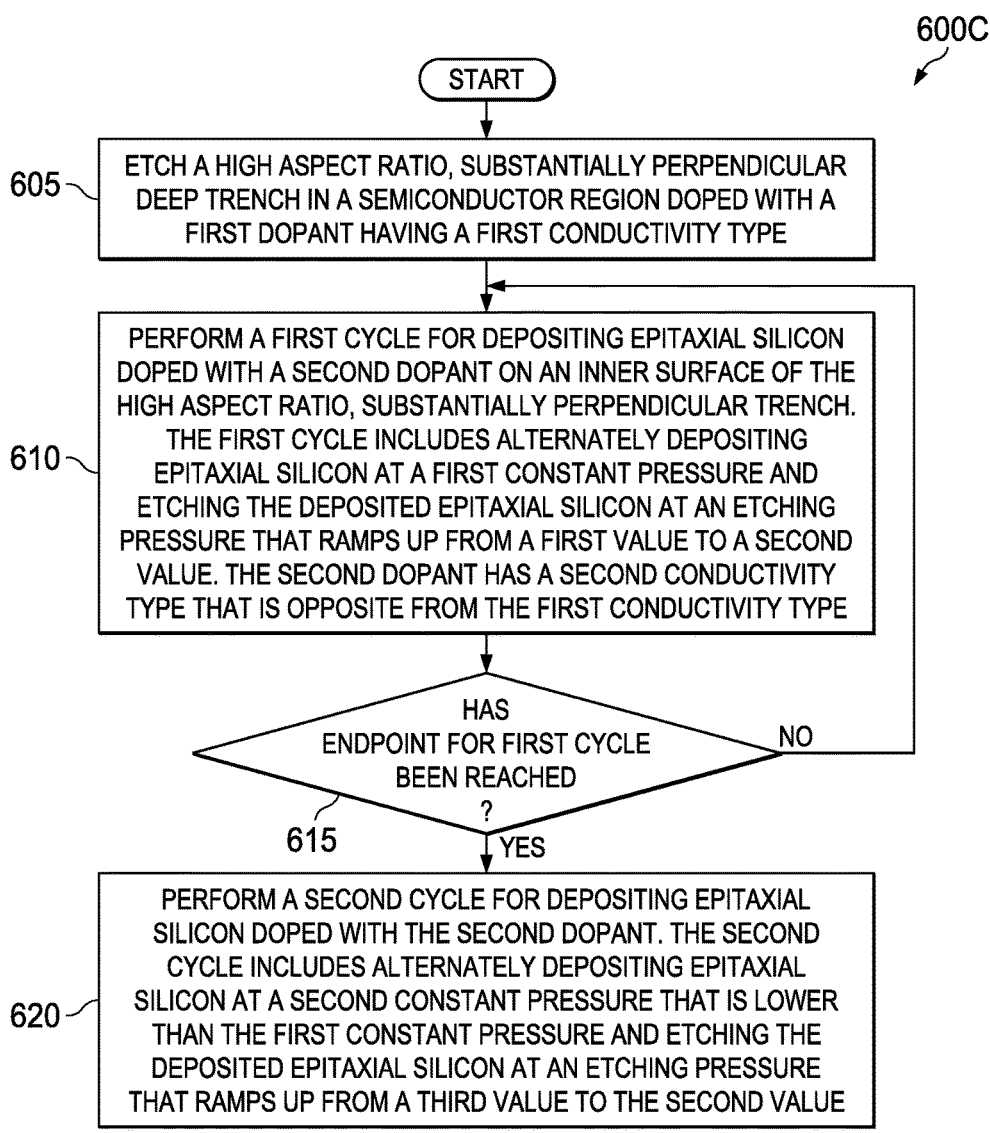
FIG. 6C depicts a method of forming a semiconductor device according to a embodiment of the disclosure.

FIG. 6C depicts a method 600C of forming a semiconductor device according an embodiment of the disclosure and as shown by the graph in FIG. 6B. The method begins with etching (605) a high aspect ratio, substantially perpendicular deep trench in a semiconductor region doped with a first dopant having first conductivity type. The method continues with performing (610) a first cycle for depositing epitaxial silicon doped with a second dopant on an inner surface of the high aspect ratio, substantially perpendicular trench. This first cycle includes alternately depositing epitaxial silicon at a first constant pressure and etching the deposited epitaxial silicon at an etching pressure that ramps up from a first value to a second value. The second dopant has a second conductivity type that is opposite from the first conductivity type. The method is performed until an endpoint for the first cycle has been reached (615). In one embodiment this endpoint may be determined to be when the trench is approximately half filled. In one embodiment this endpoint may be determined to be when the trench is filled to approximately 25 microns from the surface of the silicon. Once the endpoint for the first cycle has been reached, the method continues with performing (620) a second cycle for depositing epitaxial silicon doped with the second dopant. The second cycle includes alternately depositing epitaxial silicon at a second constant pressure that is lower than the first constant pressure and etching the deposited epitaxial silicon at an etching pressure that ramps up from a third value to the second value.

Figure 7A:
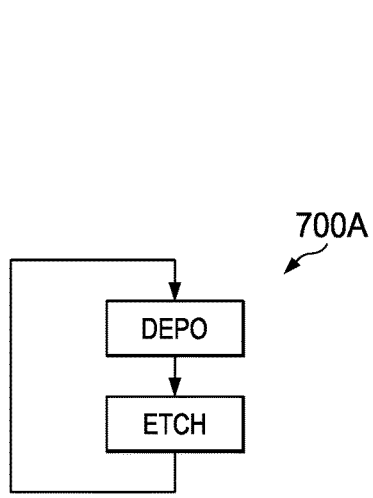
FIG. 7A illustrates a typical deposition/etching cycle used for epitaxial growth in a high aspect ratio trench according to the prior art.

FIG. 7A illustrates another aspect of the deposition/etch process according to the prior art. As illustrated in this figure, process 700A is formed of a single deposition/etching cycle. This cycle can be performed as many times as necessary in order to provide the desired fill of the deep trenches, but the process parameters remain the same each time the cycle is performed. In the disclosed embodiment shown in FIG. 7B, process 700B is broken into two or more separate cycles that may have different parameters within each cycle. In process 700B, cycle 702 uses a first pressure, e.g., 20-100 Torr, during the deposition phase and a ramping pressure during the etching phase to provide the desired fill in the deeper regions while cycle 704 uses a second pressure, e.g., 5-20 Torr, during the deposition phase and a ramping pressure during the etching phase to provide the desired fill in the shallower regions of the deep trench.

Figure 7B:
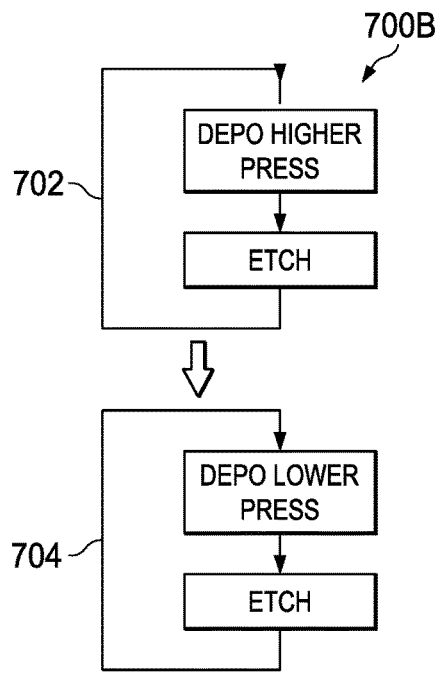
FIG. 7B illustrates a dual cycle process used for epitaxial growth in a high aspect ratio, substantially perpendicular deep trench according to an embodiment of the disclosure.
Figure 7C:
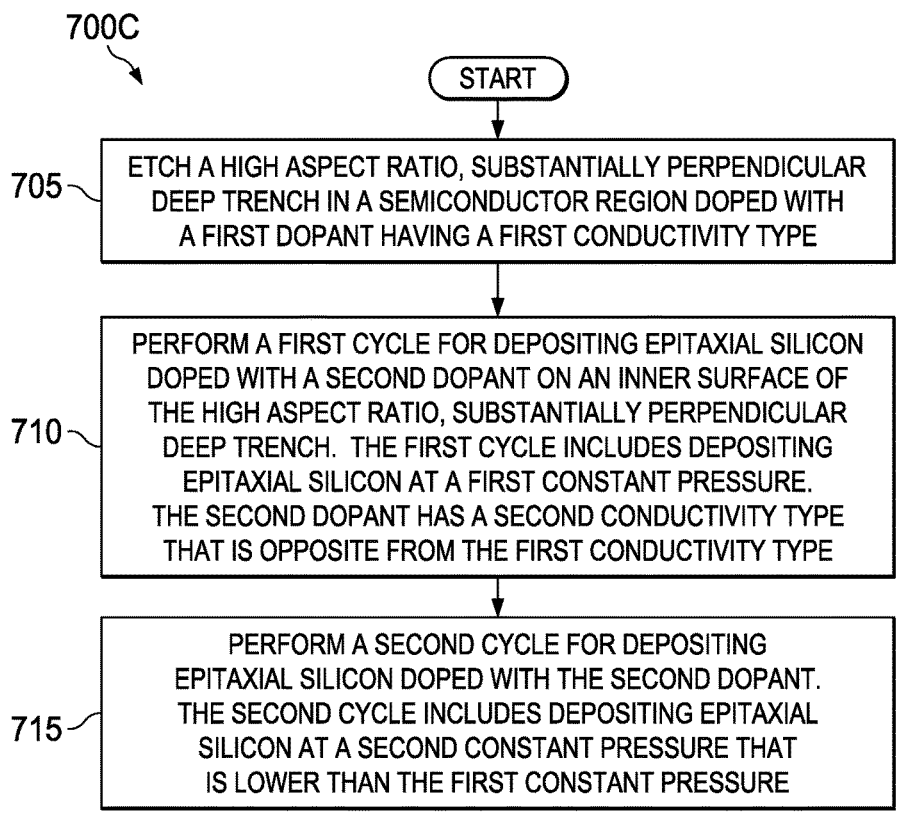
FIG. 7C depicts a method of forming a semiconductor device according to a embodiment of the disclosure.

FIG. 7C illustrates a method 700C of forming a semiconductor device according to an embodiment of the disclosure and as shown by FIG. 7B. This method again starts with etching (705) a high aspect ratio, substantially perpendicular deep trench in a semiconductor region doped with a first dopant having a first conductivity type. The method then continues with performing (710) a first cycle for depositing epitaxial silicon doped with a second dopant on an inner surface of the high aspect ratio, substantially perpendicular deep trench. The first cycle includes depositing epitaxial silicon at a first constant pressure, the second dopant having a second conductivity type that is opposite from said first conductivity type. The method further continues with performing (715) a second cycle for depositing epitaxial silicon doped with the second dopant. The second cycle includes depositing epitaxial silicon at a second constant pressure that is lower than the first pressure.

Figure 8A:
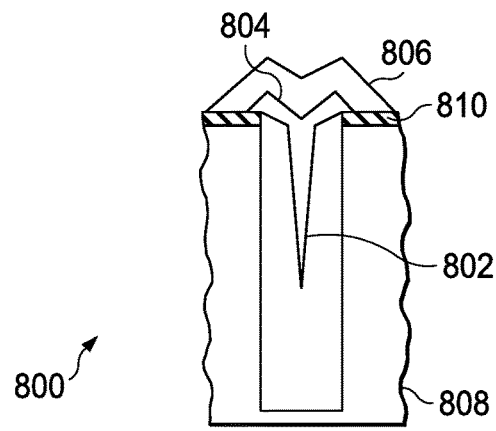
FIG. 8A schematically illustrates filling of the deep trench using the disclosed dual cycle process of epitaxial growth and an additional overfill process according to an embodiment of the disclosure.

FIG. 8A schematically illustrates the multiple fills of a deep trench according to an embodiment of the disclosure. The process of filling this deep trench is performed using three deposition stages, with the first and second deposition stages corresponding to the dual cycles shown in FIG. 7B. Table 1 below shows the disclosed process:

TABLE 1

| Recipe Element | Condition outline | Purpose |
|---|---|---|
| Prebake | $H_2$ bake | Remove native oxide, re-profile for smooth trench surface |
| First Deposition Loop (DEP1) | Lower temperature cyclic deposition with higher pressure/etch selective epitaxial growth (SEG) | Main fill of trench, lower temperature and cyclic scheme for making optimal tapered epitaxial profile. Higher pressure deposition for better bottom side fulfillment. |
| Second Deposition Loop (DEP2) | Higher temperature cyclic deposition with lower pressure/etch SEG | Fill up to close deep trench, Higher temperature and cyclic scheme for making optimal tapered epitaxial profile with higher growth rate. Lower pressure deposition for better top side fulfillment. |

TABLE 1-continued

| Recipe Element | Condition outline | Purpose |
| --- | --- | --- |
| Third Deposition Loop (DEP3) | High temperature and low HCl co-flow SEG | Overfill after deep trench closed to prevent SiO$_2$ hardmask peel off at post H$_2$ anneal, high temperature and low HCl condition for growth of low growth facet plane effectively |
| Post Anneal | H2 anneal | Anneal out crystalline defects |

As seen in Table 1, H2 bake is performed to remove any native oxide that has formed within the trench and re-profiles the trench walls to provide a smooth surface for silicon growth.

The first deposition cycle or loop, i.e., DEP1 provides the main fill of trench 800 and is performed at a lower temperature than in the prior art using cyclic deposition/etch cycle 702. Deposition/etch cycle 702 utilizes higher deposition pressure and maintains a tapered fill as shown by the upper surface 802 of DEP1. In one embodiment, this fill is performed for a period of time designed to bring the bottom of surface 802 to about the midpoint of the depth of the trench or about 25 microns from the surface. In one embodiment, DEP 1 is performed at a temperature of 880° C. DEP1 deposition step provides co-flows of dichlorosilane, diborane and HCl; the lower temperature and the disclosed process provide the optimal tapered epitaxial profile. The second deposition loop is performed next to finish filling trench 800 and brings the bottom of surface 804 essentially even with the surface of substrate 808. DEP 2 uses a higher temperature and cyclic deposition/etch cycle 704, which utilizes a lower deposition pressure to close the deep trench hold, again using co-flows of dichlorosilane, diborane and HCl; the higher temperature provides easy filling with a higher growth rate. In one embodiment, DEP2 is performed at a temperature of 925° C.

A third deposition is performed to overfill the trench and prevent peeling off of the SiO$_2$ hardmask during the post anneal and is delineated by surface 806. Rather than performing the cycle of deposition and etching as performed in DEP1 and DEP2, DEP3 provides a co-flow of dichlorosilane, diborane and a low flow of HCl to achieve the overfill shown, in which the bottom of the fill is above the surface of hardmask 810. The three deposition stages are followed by post-annealing in H$_2$ to anneal out any crystalline defects accrued during the deposition process. In one embodiment, annealing is performed at 1130° C.

Figure 8B:
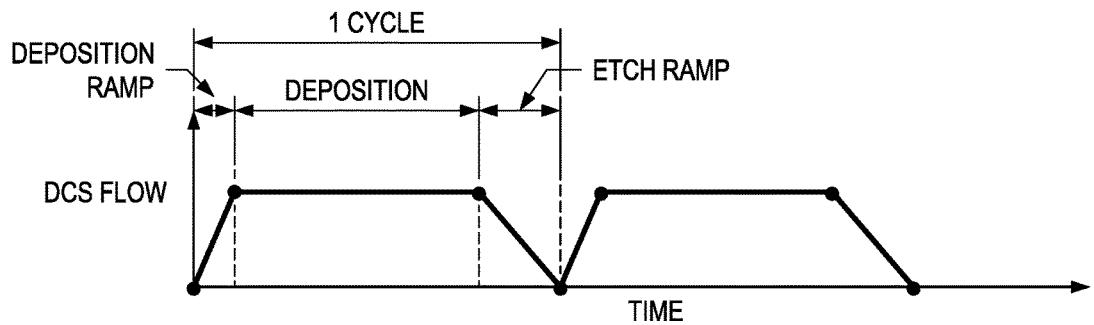
FIGS. 8B, 8C and 8D illustrates gas flow rates and pressure over time in a deposition/etch cycle according to an embodiment of the disclosure.
Figure 8C:
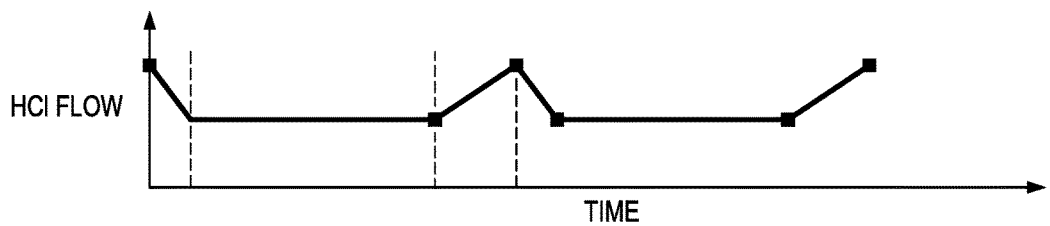
Figure 8D:
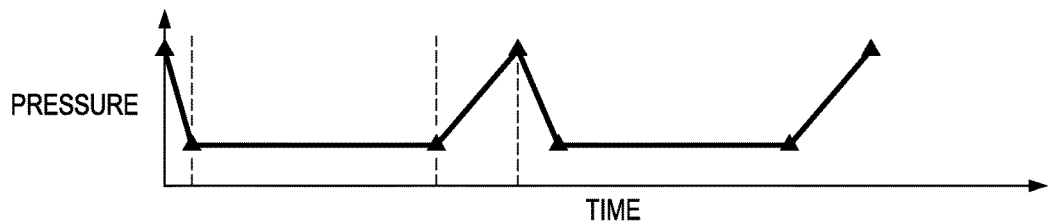

FIGS. 8B, 8C and 8D illustrate DCS flow, HCl flow and pressure respectively over time in a deposition/etch cycle for DEP1 according to an embodiment of the disclosure. As seen in these figures, when the deposition portion of the DEP1 cycle begins, there is a ramping period in which co-flows of dichlorosilane (DCS) and HCl are ramped to respective desired levels. At the same time, the pressure is ramped to a desired level, which in one embodiment, is between 20 and 100 Torr. Once the desired levels have been reached, both the pressure and co-flows are held constant for the duration of the deposition portion of the cycle. As the etch phase is entered, the flow of DCS is ramped down, the flow of HCl is ramped upward and the pressure is ramped upward over the etching period. Once the predetermined levels are reached, the cycle is complete. As previously mentioned, the cycle will be repeated a number of times. The DEP2 cycle uses a similar loop, with pressure during the deposition phase dropped to no more than 20 Torr.

Applicants have performed deposition of three different sets of deep silicon trenches in which the deposition stage was performed at different pressures or pressure combinations and verified the results using SEM photography (not specifically shown). A first test with high pressure growth, e.g., at 20-100 Torr, provided good filling in the lower portions of the trench, but created seams in the upper portions of the trench. Conversely, a second test, with low pressure deposition, e.g., 5-20 Torr, contained seams in the lower portion of the trenches and a good fill in the upper regions. A third test using the disclosed high pressure deposition followed by low-pressure deposition showed a more consistent fill with fewer seams in the trenches.

Figure 9A:
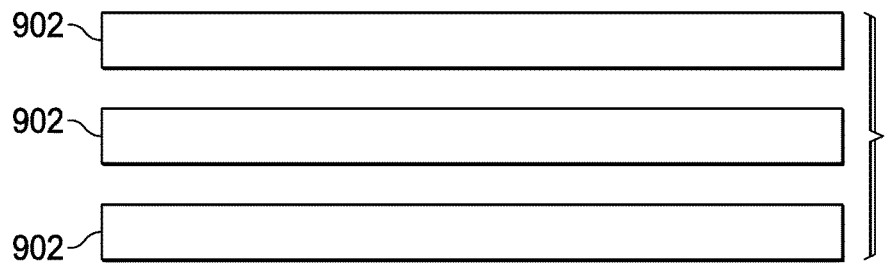
FIG. 9A illustrates a schematic top view of a prior art arrangement of silicon trenches.
Figure 9B:
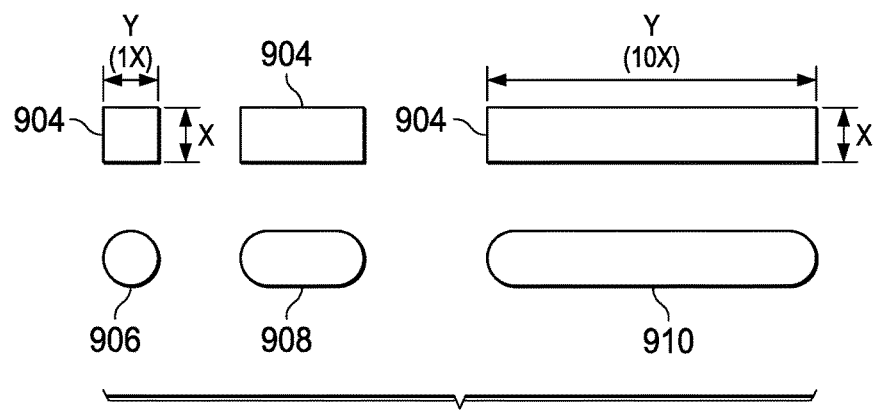
FIG. 9B illustrates a schematic top view of various shapes of silicon trenches according to embodiments of the disclosure.

Applicant has also determined that the rate of growth of silicon within the deep trenches is influenced by the shape of the deep trench as seen in cross-section at the surface of the epitaxial layer. FIG. 9A shows a top-down view of a prior art layout of trenches in which the trenches 902 are provided as long linear shapes extending across the region where deep trenches are desired. However, Applicants have determined that when the shape of the trench at an intersection with the surface of the substrate is circular 909, elliptical 908 or shorter rectangles 904, as shown in FIG. 9B, these shapes in combination with the disclosed deposition/etching cycles enhance the growth rate of silicon within the trench while minimizing defects. As seen in this figure, a "rectangular trench" 904 as recited in this application refers to a trench that has a length to width ratio of between 1:1 and 10:1 inclusive. Similarly, an elliptical trench 908 can be "stretched" to form a longer trench 910. Again, the length to width ratio of the "circular/elliptical trench" would be in the range between 1:1 and 10:1 inclusive.

Figure 10A:
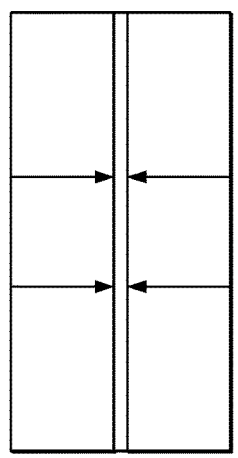
FIG. 10A illustrates a schematic top view of an epitaxial filled trench which has a large pinch-off contact area created using a linear pattern for trenches.
Figure 10B:
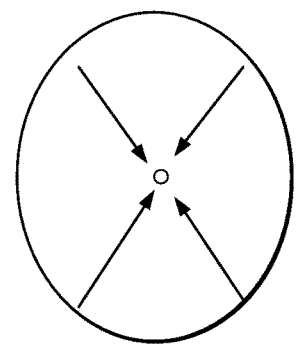
FIG. 10B illustrates a schematic top view of an epitaxial filled trench which has the small pinch-off contact area created using a circular pattern for trenches.

Another benefit of the disclosed shapes is the reduction in pinch-off contact areas, as shown in FIGS. 10A and 10B. FIG. 10A illustrates a section of a traditional long, linear trench, in which any location along the length of the trench is subject to forming a pinch-off area. In contrast, as shown in FIG. 10B, as a circular trench grows inward, a single contact area is subject to forming a pinch-off area. As a result, these layouts provide reduced stress in the trench areas and therefore a lower defect density.

FIG. 11A illustrates that the prior art linear arrangement only allows growth on a limited plane, e.g., the 011 plane. This growth plane is illustrated by the solid arrows. As shown in FIG. 11B, providing either a curved surface (in circular or elliptical designs), or else a surface running in another plane (in shorter, rectangular shapes) allows growth along another plane, e.g., the 010 plane. Additionally, the gas supply, illustrated in these figures by the dotted lines, is able to be provided to the traditional linear shape from only two directions, while the disclosed shapes allow gas to be provided from all four directions. FIG. 11C illustrates the additional growth provided by the disclosed shapes. As seen in this figure, which is drawn from an actual SEM photograph, the deep silicon trenches form a rectangular intersection with the surface of the substrate. Straight regions, e.g., circled region 1102, exhibit a slow growth rate while curved regions, e.g., circled region 1104, exhibit an enhanced growth rate.

Applicants have examined SEM photographic evidence that illustrates the differences that the shape of the trenches can make by reducing the pinch-off region at the growing sidewalls, reducing the stress that occurs during growth of the silicon, and providing low defect density. When the filled silicon trenches were patterned as lines; Applicants found that these trenches contained many defects. In contrast, when the filled silicon trenches were produced using a circular pattern for the silicon trenches, these trenches contained no defects. Table 2 below summarizes the benefits of the disclosed rectangular/circular/elliptical patterns:

TABLE 2

| Pattern | Epitaxial pinch-off contact area | Defects @XSEM | Full Depo time |
|---|---|---|---|
| Line | Large | Many | — |
| New | Small | None | −40% |

As shown in Table 2, using the disclosed new patterns for silicon trenches creates smaller areas for epitaxial pinch-off contact, provides significantly fewer defects and in at least one embodiment reduces the deposition time by forty percent.

Applicants have disclosed a number of modifications that can be made to existing practices for forming epitaxial silicon in high aspect ratio, substantially perpendicular, trenches. These modifications include at least ramping the pressure up from a lower pressure to a higher pressure during each etching period, filling lower portions of the trench using a higher deposition pressure and upper portions of the trench using a lower deposition pressure, and designing trenches having a length to width ratio between 1:1 and 10:1. The combination of these modifications produces fills that have one or more of improved filling with fewer voids and seams, fewer defects, and faster growth.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A method of forming a semiconductor device comprising: etching a high aspect ratio, substantially perpendicular deep trench in a semiconductor region doped with a first dopant having first conductivity type; and
performing a first cycle for depositing epitaxial silicon doped with a second dopant on an inner surface of said high aspect ratio, substantially perpendicular trench, said first cycle comprising alternately depositing epitaxial silicon at a first constant pressure and etching said deposited epitaxial silicon at an etching pressure that ramps up from a first value to a second value, said second dopant having a second conductivity type that is opposite from said first conductivity type;
wherein said depositing of said epitaxial silicon ends before said etching of said deposited epitaxial silicon begins.

2. The method as recited in claim 1 wherein said first value is 20 Torr and said second value is 100 Torr.

3. The method as recited in claim 2 wherein said first constant pressure is 20 Torr.

4. The method as recited in claim 1 further comprising performing said first cycle until approximately one-half of the depth of the high aspect ratio, substantially perpendicular deep trench is filled.

5. The method as recited in claim 4 further comprising performing a second cycle for depositing epitaxial silicon doped with said second dopant, said second cycle comprising alternately depositing epitaxial silicon at a second constant pressure that is lower than said first constant pressure and etching said deposited epitaxial silicon at an etching pressure that ramps up from a third value to said second value.

6. The method as recited in claim 5 wherein said second constant pressure is 10 Torr.

7. The method as recited in claim 6 wherein said third value is 10 Torr.

8. The method as recited in claim 5 further comprising performing said etching at a flow rate of HCl that ramps from 200 sccm to 250 sccm over the etching period.

9. The method as recited in claim 5 wherein said etching forms trenches having an intersection with a surface of said substrate that forms one of a circle, an ellipse and a rectangle, said one of the circle, the ellipse and the rectangle having a length to width ratio no greater than 10:1.

10. The method as recited in claim 1, wherein said depositing of said epitaxial silicon is performed with a flow rate of HCl that is constant.

11. The method as recited in claim 10, wherein, said depositing of said epitaxial silicon is also performed with a flow rate of $SiH_2Cl_2$ that is constant.

12. The method as recited in claim 11, wherein, during said etching of said deposited epitaxial silicon, said flow rate of $SiH_2Cl_2$ is continuously ramped down and said flow rate of HCl is continuously ramped up.

13. A method of forming a semiconductor device comprising:
etching a high aspect ratio, substantially perpendicular deep trench in a semiconductor region doped with a first dopant having a first conductivity type;
performing a first cycle for depositing epitaxial silicon doped with a second dopant on an inner surface of said high aspect ratio, substantially perpendicular deep trench, said first cycle comprising depositing epitaxial silicon at a first constant pressure and a first constant temperature, said second dopant having a second conductivity type that is opposite from said first conductivity type; and
after said first cycle, performing a second cycle for depositing epitaxial silicon doped with said second dopant, said second cycle comprising depositing epitaxial silicon at a second constant pressure that is lower than said first pressure and at a second constant temperature that is higher than said first constant temperature.

14. The method as recited in claim 13 wherein said first constant pressure is in the range of 20-100 Torr and said second constant pressure is in the range of 5-20 Torr.

15. The method as recited in claim 13 wherein said first cycle and said second cycle further comprise etching said deposited epitaxial silicon at a pressure that ramps up from a respective constant pressure to 100 Torr.

16. The method as recited in claim 15 wherein etching said high aspect ratio, substantially perpendicular deep trenches creates an intersection of said high aspect ratio, substantially perpendicular deep trenches with a surface of said semiconductor region forms one of a circle, an ellipse and a rectangle, said one of the circle, the ellipse and the rectangle having a length to width ratio no greater than 10:1.

17. The method as recited in claim 13, wherein said first temperature is less than 900 degrees Celsius and said second temperature is greater than 900 degrees Celsius.

18. The method as recited in claim 13, wherein said depositing said epitaxial silicon in said first cycle comprises depositing said epitaxial silicon with a flow rate of HCl that is constant.

19. The method as recited in claim 13, wherein said depositing said epitaxial silicon in said first cycle comprises depositing said epitaxial silicon with co-flows of HCl and $SiH_2Cl_2$, the flow rates of HCl and $SiH_2Cl_2$ being constant during said depositing of said epitaxial silicon.

20. The method as recited in claim 19, wherein said first cycle further comprises, after said depositing of said epitaxial silicon, etching said deposited epitaxial silicon with said flow rate of $SiH_2Cl_2$ being continuously ramped down during said etching and said flow rate of HCl being continuously ramped up during said etching.

* * * * *